United States Patent [19]
Sichert et al.

[11] Patent Number: 6,064,228
[45] Date of Patent: May 16, 2000

[54] CIRCUIT CONFIGURATION FOR GENERATING DIGITAL SIGNALS

[75] Inventors: Christian Sichert, München; Robert Kaiser, Kaufering; Norbert Wirth, Unterschleissheim, all of Germany

[73] Assignee: Siemens Aktiengesellschaft, Munich, Germany

[21] Appl. No.: 09/095,261

[22] Filed: Jun. 10, 1998

[30] Foreign Application Priority Data

Jun. 10, 1997 [DE] Germany .......................... 197 24 451

[51] Int. Cl.[7] .................. H03K 19/0175; H03K 19/094; H03K 17/687; H03L 5/00
[52] U.S. Cl. ............................. 326/68; 326/68; 326/83; 326/121; 327/333; 327/437
[58] Field of Search .................. 326/68, 80, 81, 326/83, 86, 121; 327/333, 437

[56] References Cited

U.S. PATENT DOCUMENTS

| | | | |
|---|---|---|---|
| 5,525,926 | 6/1996 | Merritt | 327/535 |
| 5,627,487 | 5/1997 | Keeth | 327/112 |
| 5,834,948 | 11/1998 | Yoshizaki et al. | 326/81 |
| 5,905,402 | 5/1999 | Kim et al. | 327/536 |

FOREIGN PATENT DOCUMENTS 33 47484C2   7/1987   Germany .

OTHER PUBLICATIONS

Japanese Patent Abstract JP 1–319322A, Section E, vol. 14 (1990) No. 125 (E–900) (Kurose, Y.) dated Mar. 8, 1990.

*Primary Examiner*—Michael Tokar
*Assistant Examiner*—Vibol Tan
*Attorney, Agent, or Firm*—Herbert L. Lerner; Laurence A. Greenberg; Werner H. Stemer

[57] ABSTRACT

The device for generating digital signal levels can be used for signals of various logic standards. A voltage terminal for feeding an external reference voltage is provided as well as an internal voltage generator. An internal reference voltage of the voltage generator can be selectively connected to the device via a switch. The switch is actuated by a level converter. Coupling elements prevent faults caused by the supply voltage.

4 Claims, 1 Drawing Sheet

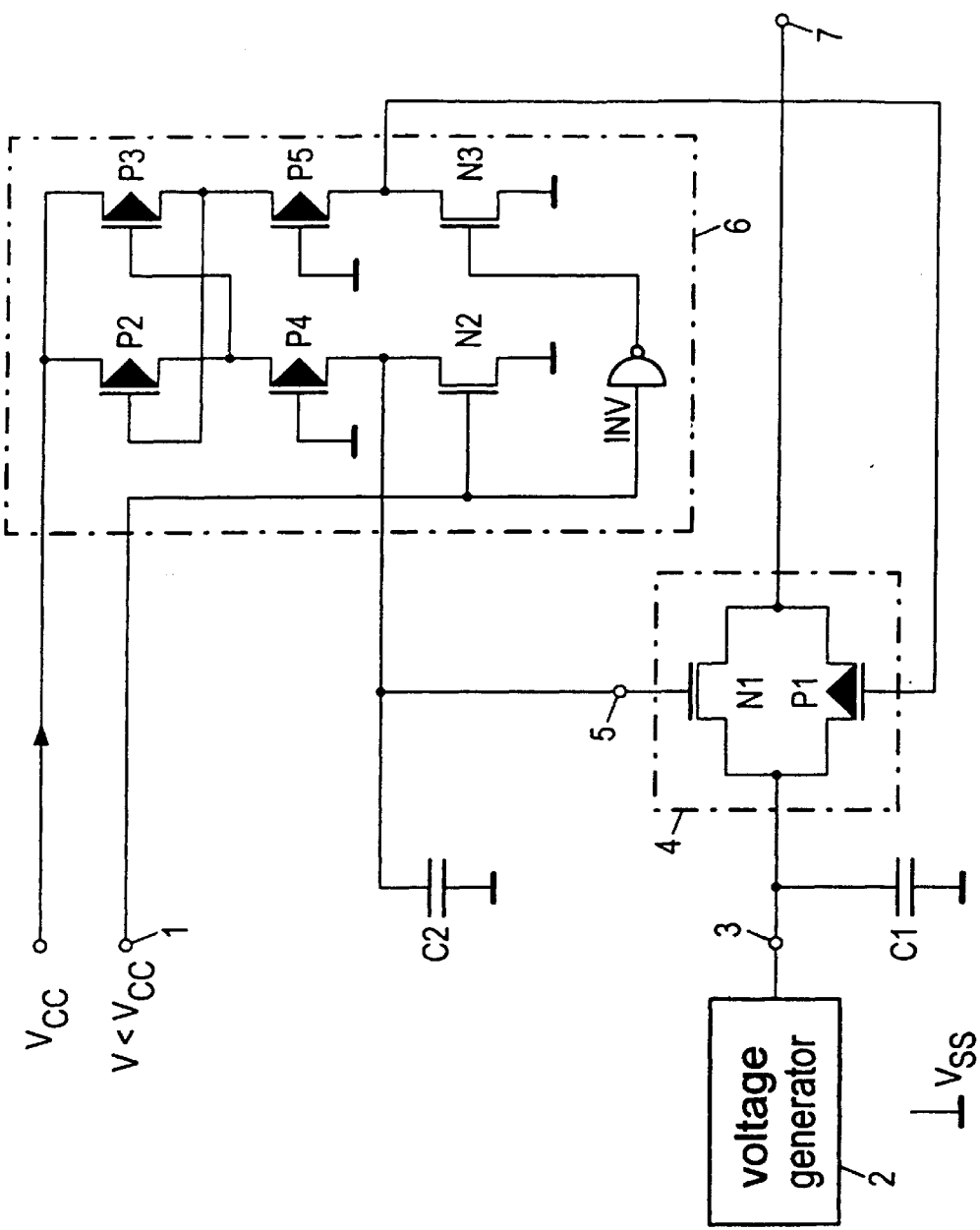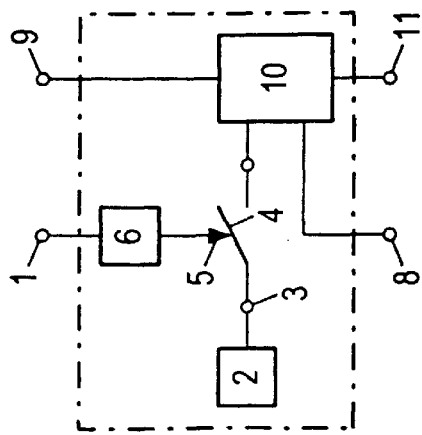

CIRCUIT CONFIGURATION FOR GENERATING DIGITAL SIGNALS

BACKGROUND OF THE INVENTION

FIELD OF THE INVENTION

The invention relates to a circuit configuration with a device for generating digital signals.

As compared with the processing of analog signals, digital signal processing is advantageous in that the signals to be processed, for example binary signals, have a considerably greater signal-to-noise ratio. Even small errors can irreversibly falsify an analog signal. Digital signals are also subject to various kinds of faults, for example noise or superimposed voltage peaks. The degree of these faults depends as a rule on the type and scope of the digital processing. In a series of signal processing stages, faults can accumulate in such a way that even in the case of binary signals the actual signal can no longer be unambiguously determined. At certain points of the signal processing system, for example at the inputs of a logic module, the digital signals are fed to devices for generating digital signals, for example signal amplifiers. These devices, which are also known in digital technology under the designation of receivers or signal regenerators, serve to regenerate the levels of the digital signals. For this purpose, the voltage levels of the individual signals are generally raised or lowered to the agreed setpoint value, provided that the signals lie within a tolerance range and can be assigned to a specific signal value. Which tolerance range is to be used here depends on the standard that has been selected for switching to the signal processing system.

The multiplicity of available logic standards includes, by way of example, the following two:

The LVTTL standard (LVTTL=Low Voltage Transistor/Transistor Logic) provides the voltage levels 0.8 V and 2.0 V for representing the binary states "low" and "high".

In the SSTL standard, the signal value "high" is expressed by increasing the signal by 0.4V with respect to a reference voltage, and the signal value "low" is expressed by reducing the signal by 0.4V with respect to the reference voltage.

However, the signal regenerators do not just adapt the binary signal values lying in a tolerance range to these voltage levels. At the same time, when there is a change from one signal value to another, for example "low" to "high", they ensure that the changeover of the signal levels is as rapid as possible. Ideally, the edges of a voltage signal of the binary values which is plotted against time are as steep as possible. Signal regenerators are used wherever digital values have to be evaluated and used in a flexible way. They are also used, for example, in memories for freshening up the address control signals, RAS and CAS, enable signals and the like.

It is not readily possible to use a signal regenerator when there are various logic standards. Signal regenerators can also be used in semiconductor chips which are compatible, for example, with two logic standards. Then, in each case, one signal regenerator has to be provided for each standard. The expenditure, of course, is considerable. Concurrently, the number of connections on the chip increases, which then increases the risk that the internal voltages on the chip affect one another.

German patent DE 33 47 484 C2 discloses a circuit configuration which has the purpose of adapting input signals to a logic signal level for use in logic circuits and process data circuits, and which has a comparator with a positive and a negative input. The input signals are supplied into the circuit by an external input terminal.

Japanese patent application JP 1-319322 A in: Patent Abstracts of Japan, Section E. Vol. 14 (1990) No. 125 (E-900) describes a circuit for converting levels with an operational amplifier which can be connected via a circuit configuration either to an input terminal or to ground. A reference voltage is fed via the non-inverting input of the operational amplifier.

SUMMARY OF THE INVENTION

It is accordingly an object of the invention to provide a circuit configuration for producing digital signals, which overcomes the above-mentioned disadvantages of the prior art devices and methods of this general type and which is a single device that can be operated with various standards and which has only a low degree of sensitivity to voltage fluctuations in the voltages fed to it.

With the foregoing and other objects in view there is provided, in accordance with the invention, a circuit configuration with a device for generating digital signals, comprising:

a voltage terminal connected to the device for feeding an external reference voltage to the device;

a voltage generator for generating an internal reference voltage and a switch connected between the voltage generator and the device;

a level converter connected to the switch, the level converter outputting a switching signal for switching the switch raised to a level above a switching threshold of the switch;

the level converter having a pair of mutually cross-coupled transistors each having a channel side, and coupling transistors each having a control terminal connected to a first supply potential, the coupling transistors capacitively coupling the cross-coupled transistors on the channel side to the first supply potential.

In accordance with an added feature of the invention, the switch includes a switching transistor of a first conductivity type and a switching transistor of a second conductivity type, the switching transistors having channels connected in parallel.

In accordance with another feature of the invention, a control coupling capacitor is connected between a control contact of the switch and the first supply potential.

In accordance with a concomitant feature of the invention, an output coupling capacitor is connected between an output of the voltage generator and the first supply potential.

Since the circuit configuration according to the invention provides only one device for generating digital signals, the costs can be reduced in comparison with solutions with two such devices. In addition, there can be a savings in terms of chip area. Further, the invention provides the advantage that, owing to coupling elements, the internal reference voltage is strongly coupled to the internal voltages. The circuit configuration according to the invention also has a low degree of sensitivity to fluctuations in the supply voltage.

Other features which are considered as characteristic for the invention are set forth in the appended claims.

Although the invention is illustrated and described herein as embodied in a circuit configuration for generating digital signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic block circuit diagram of the circuit configuration according to the invention; and FIG. 2 is a more detailed circuit diagram for providing an internal reference voltage.

DESCRIPTION OF THE PREFERRED EMBODIMENTS

Referring now to the figures of the drawing in detail and first, particularly, to FIG. 1 thereof, there is seen a device for generating digital signals 10 with inputs and outputs which are represented by an input terminal 9 and an output terminal 11. The device for generating digital signals 10 is connected to a voltage terminal 8, via which an external reference voltage $V_{ref,ext}$ can be fed to the device 10. Furthermore, the device 10 is connected via a switch 4 to the output 3 of a voltage generator 2. The voltage generator 2 generates an internal reference voltage $V_{ref,int}$ which should be kept as constant as possible independently of the respective load or other interference variables, such as for example fluctuations in the operating voltage. Neither the voltage generator 2 nor the device 10 are the subjects of the invention and, for that reason, they are not described here in more detail.

The switch 4 is connected via a control contact 5 (driver terminal) to a level converter 6. It can be actuated with a switching signal which can be fed to the level converter 6 at a switching input 1. The level converter 6 ensures that, even in the case of weak switching signals, the switch 4 is set to full drive level. The layout and the method of operation of the level converter 6 are explained in more detail below.

A digital signal present at the input 9 of the device 10 is evaluated by comparison with a reference signal as being "low" or "high". If the voltage level of the digital signal at the input lies below the voltage level of the reference signal, then the device 10 generates a "low" signal. The output signal at the output 11 representing "low" may, for example, be 0V. If the voltage level of the digital signal is above the voltage level of the reference signal, there is, in contrast, a "high" signal with, for example, 2.5V available at the output 11 of the device 10. By selecting the voltage level of the reference signal, the switch-over threshold is therefore set between "low" and "high". This makes it possible to use the device 10 with various logic standards.

The circuit configuration according to the invention as in FIG. 1 can be operated with two different logic standards.

In a first method of operation, the signals at the input 9 comply with the LVTTL standard. The reference signal used is then the internally generated reference voltage $V_{ref,int}$. The switching signal at the switching input 1 of the level converter 6 is to be selected in such a way that the switch 4 is closed. The internal reference voltage $V_{ref,int}$ is present at the device 10, while the voltage terminal 8 is not assigned, that is to say does not hold any voltage.

In a second mode of operation, the signals at the input 9 correspond to another logic standard which is different from the LVTTL standard. For example, SSTL signals are present at the input 9. Here, the switch 4 is to be actuated in such a way that there is no connection between the voltage generator 2 and the device 10. The external reference voltage $V_{ref,ext}$, which is supplied, for example, by an external voltage generator which is also provided for supplying voltage to the other circuit units, is present at the voltage terminal 8. By virtue of the fact that the external reference voltage $V_{ref,ext}$ is supplied externally and is not generated internally, the use of the circuit configuration according to the invention with various logic standards is very simple. There is no need for an additional voltage generator to generate the external reference voltage $V_{ref,ext}$ for the circuit configuration according to the invention.

The part of the circuit configuration according to FIG. 1 which comprises the voltage generator 2, the circuit 4 and the level converter 6 is illustrated in FIG. 2. The switch 4 is composed here of two transistors of different conductivity types N1 and P1, which are connected in parallel on the channel side. Via the channel paths which are connected in parallel it is possible to produce a connection between the output terminal 3 of the voltage generator 2 and a further voltage terminal 7 of the device 10. An output coupling capacitor C1 is connected between the output terminal 3 of the voltage generator 2 and a first supply potential $V_{SS}$.

The switch 4 can be actuated via the level converter 6. The level converter 6 has two transistors of the p-channel type P2 and P3 which are each connected by their source terminals to a second supply potential $V_{CC}$. Their drain terminals are each connected to the gate terminals of the other transistor in such a way that a cross coupling is produced. Furthermore, the drain terminals of the transistors P2 and P3 are each connected to a series circuit composed of a p-channel transistor P4 or P5 and an n-channel transistor N2 or N3. The gate terminals of the p-channel transistors P4 and P5 are each connected to the first supply potential $V_{SS}$. The gate terminal of the n-channel transistor N2 is directly connected to the switching input 1 of the level converter 6. The gate terminal of the n-channel transistor N3 is connected to the switching input 1 of the level converter 6 via an inverter INV. The inverter INV inverts the switching signal present at the switching input 1. The drain terminal of the p-channel transistor P4, and thus the drain terminal of the n-channel transistor N2, are connected, firstly, to the gate terminal of the one transistor N1 of the switch 4 and, on the other hand, to the first supply potential $V_{SS}$ via a control coupling capacitor C2. The drain terminal of the p-channel transistor P5, and thus the drain terminal of the n-channel transistor N3, lead to the further transistor P1 of the switch 4.

If a signal below a specific switching threshold is present at the switching input 1 of the level converter 6, then the n-channel transistor N3 is connected through, after the switching signal has been inverted by the inverter INV. Owing to the cross-coupling, the first supply potential $V_{SS}$ is then present at the gate terminal of the p-channel transistor P2, and the p-channel transistor P2 then also switches through. Since the n-channel transistor N2, at whose gate terminal the switching signal is also present, is nonconductive, the gate terminal of the n-channel transistor N1 of the switch 4 assumes the second supply potential $V_{CC}$. At the same time, the p-channel transistor P1 of the switch 4 assumes the first supply potential $V_{SS}$, since the n-channel transistor N3 has been switched through. Both the n-channel transistor N1 and the p-channel transistor P1 of the switch 4 are switched through. The switch 4 is therefore closed in this case.

In the case of a switching signal which lies above the switching threshold, the n-channel transistor N2 is switched through and the n-channel transistor N3 is nonconductive. The first supply potential $V_{SS}$ is present at the gate terminal of the p-channel transistor P3, and the transistor P3 switches through. The effect of this is that the gate terminal of the p-channel transistor P1 of the switch 4 assumes the second supply potential $V_{CC}$, and becomes nonconductive. The n-channel transistor N1 of the switch 4 also becomes nonconductive, since the first supply potential $V_{SS}$ is present at its gate terminal. The switch 4 is therefore opened in this case.

The result of implementing the switch 4 with two transistors N1, P1 connected in parallel is that, in the second mode of operation, the voltage generator 2 is virtually completely separated from the device 10. Fluctuations in the internal supply voltage therefore have hardly any effect on the external reference voltage $V_{ref,ext}$.

The coupling capacitors C1 and C2 and the p-channel transistors P4 and P5 are provided to give the circuit configuration greater stability when faults occur. The output coupling capacitor C1 brings about strong coupling of the internal reference voltage $V_{ref,int}$ at the output terminal 3 of the voltage generator 2 with the first supply potential $V_{SS}$. Since the first supply potential $V_{SS}$ constitutes the reference potential, a large degree of coupling is desirable. Likewise, the control terminal of the switch 4, specifically the gate terminal of the n-channel transistor N1 of the switch 4, is coupled to the first supply potential $V_{SS}$ via the control coupling capacitor C2. The effect of transient interference variables on the internal reference voltage $V_{ref,int}$ or the control terminal of the switch 4 is significantly reduced by the integrating effect of the coupling capacitors.

The p-channel transistors P4 and P5 constitute a capacitive divider owing to the parasitic capacitances between the drain and gate, and between the source and gate, respectively. As a result, the second supply potential $V_{CC}$ which is different from the reference potential is coupled to the internal reference voltage $V_{ref,int}$ only to a small degree. The effects of brief fluctuations in the second supply potential $V_{CC}$ on the internal reference voltage $V_{ref,int}$ are kept small.

The capacitances of the coupling capacitors C1 and C2 are greater than the capacitances of the p-channel transistors P4 and P5 by orders of magnitude.

We claim:

1. A circuit configuration, comprising:
   a device for generating digital signals;
   a voltage terminal connected to said device for feeding an external reference voltage to said device;
   a voltage generator for generating an internal reference voltage and a switch connected between said voltage generator and said device;
   a level converter connected to said switch, said level converter outputting a switching signal for switching the switch raised to a level above a switching threshold of said switch;
   said level converter having a pair of mutually cross-coupled transistors each having a channel side, and coupling transistors each having a control terminal connected to a first supply potential, said coupling transistors capacitively coupling said cross-coupled transistors on the channel side to the first supply potential.

2. The circuit configuration according to claim 1, wherein said switch includes a switching transistor of a first conductivity type and a switching transistor of a second conductivity type, said switching transistors having channels connected in parallel.

3. The circuit configuration according to claim 1, which further comprises a control coupling capacitor connected between a control contact of said switch and the first supply potential.

4. The circuit configuration according to claim 1, which further comprises an output coupling capacitor connected between an output of said voltage generator and the first supply potential.

* * * * *